United States Patent
Min et al.

(10) Patent No.: US 9,786,674 B2
(45) Date of Patent: Oct. 10, 2017

(54) DISCRETE STORAGE ELEMENT FORMATION FOR THIN-FILM STORAGE DEVICE

(71) Applicant: Taiwan Semiconductor Manufacturing Company, Ltd., Hsin-Chu (TW)

(72) Inventors: Chung-Chiang Min, Hsinchu County (TW); Chang-Ming Wu, New Taipei (TW); Shih-Chang Liu, Kaohsiung County (TW); Yuan-Tai Tseng, Hsinchu County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/941,835

(22) Filed: Nov. 16, 2015

(65) Prior Publication Data

US 2017/0141120 A1    May 18, 2017

(51) Int. Cl.
| | | |
|---|---|---|
| H01L 21/00 | (2006.01) | |
| H01L 27/11568 | (2017.01) | |
| H01L 29/423 | (2006.01) | |
| H01L 21/28 | (2006.01) | |
| H01L 21/02 | (2006.01) | |
| H01L 29/66 | (2006.01) | |
| H01L 29/792 | (2006.01) | |

(52) U.S. Cl.
CPC .... *H01L 27/11568* (2013.01); *H01L 21/0262* (2013.01); *H01L 21/02164* (2013.01); *H01L 21/02238* (2013.01); *H01L 21/02532* (2013.01); *H01L 21/02601* (2013.01); *H01L 21/28282* (2013.01); *H01L 29/42344* (2013.01); *H01L 29/42348* (2013.01); *H01L 29/66833* (2013.01); *H01L 29/792* (2013.01)

(58) Field of Classification Search
CPC .................................................. H01L 27/11568
See application file for complete search history.

(56) References Cited

U.S. PATENT DOCUMENTS

| | | |
|---|---|---|
| 8,593,854 B1 | 11/2013 | Chih et al. |
| 8,605,523 B2 | 12/2013 | Tao et al. |
| 8,630,132 B2 | 1/2014 | Cheng et al. |
| 8,760,948 B2 | 6/2014 | Tao et al. |
| 8,869,436 B2 | 10/2014 | Tsai et al. |
| 2013/0234094 A1 | 9/2013 | Chang et al. |
| 2013/0336041 A1 | 12/2013 | Tsai et al. |
| 2014/0032871 A1 | 1/2014 | Hsu et al. |

(Continued)

*Primary Examiner* — William Harriston
(74) *Attorney, Agent, or Firm* — Haynes and Boone, LLP (57) ABSTRACT

Provided is a method of forming a decoupling capacitor device and the device thereof. The decoupling capacitor device includes a first dielectric layer portion that is deposited in a deposition process that also deposits a second dielectric layer portion for a non-volatile memory cell. Both portions are patterned using a single mask. A system-on-chip (SOC) device is also provided, the SOC include an RRAM cell and a decoupling capacitor situated in a single intermetal dielectric layer. Also a method for forming a process-compatible decoupling capacitor is provided. The method includes patterning a top electrode layer, an insulating layer, and a bottom electrode layer to form a non-volatile memory element and a decoupling capacitor.

20 Claims, 13 Drawing Sheets

(56) References Cited

U.S. PATENT DOCUMENTS

| | | |
|---|---|---|
| 2014/0146593 A1 | 5/2014 | Tsai et al. |
| 2014/0153321 A1 | 6/2014 | Liaw |
| 2014/0153345 A1 | 6/2014 | Kim et al. |
| 2014/0166961 A1 | 6/2014 | Liao et al. |
| 2014/0175365 A1 | 6/2014 | Chang et al. |
| 2014/0177352 A1 | 6/2014 | Lum |
| 2014/0203236 A1 | 7/2014 | Chen et al. |
| 2014/0233330 A1 | 8/2014 | Ko et al. |
| 2014/0241077 A1 | 8/2014 | Katoch et al. |
| 2014/0264222 A1 | 9/2014 | Yang et al. |
| 2014/0264233 A1 | 9/2014 | Tu et al. |
| 2014/0269114 A1 | 9/2014 | Yang et al. |
| 2016/0204212 A1* | 7/2016 | Su .................... H01L 21/28273 257/325 |

* cited by examiner

DISCRETE STORAGE ELEMENT FORMATION FOR THIN-FILM STORAGE DEVICE

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

Many of the technological advances in semiconductors have occurred in the field of memory devices, especially non-volatile memory devices. A variety of structures and configurations have been developed to scale up a memory density in the non-volatile memory device. More particularly, a layer of discontinuous storage elements to store charge in a non-volatile memory device has been used to reach such a goal. However, size uniformity and distribution of such discontinuous storage elements may directly impact a memory device's characteristics such as for example, retention and threshold voltage. That is, an inconsistent size distribution of discontinuous storage elements in a memory device may disadvantageously affect performance of the memory device (e.g., a non-uniform threshold voltage distribution and degraded retention). Typically, a memory device that uses discontinuous storage elements to store a charge tends to have such an issue (i.e., inconsistent size distribution) and tends to be vulnerable to the inconsistent size distribution of the discontinuous storage elements. Thus, a memory device that uses a layer of discontinuous storage elements with more immunity to the inconsistent size distribution is needed.

BRIEF DESCRIPTION OF THE DRAWINGS

Aspects of the present disclosure are best understood from the following detailed description when read with the accompanying figures. It is emphasized that, in accordance with the standard practice in the industry, various features of the figures are not drawn to scale. In fact, the dimensions of the various features may be arbitrarily increased or reduced for clarity of discussion.

The various features disclosed in the drawings briefly described above will become more apparent to one of skill in the art upon reading the detailed description below. Where features depicted in the various figures are common between two or more figures, the same identifying numerals have been used for clarity of description.

DETAILED DESCRIPTION

It is to be understood that the following disclosure provides many different embodiments and examples for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features in the figures may be arbitrarily drawn in different scales for the sake of simplicity and clarity.

Figure 1:
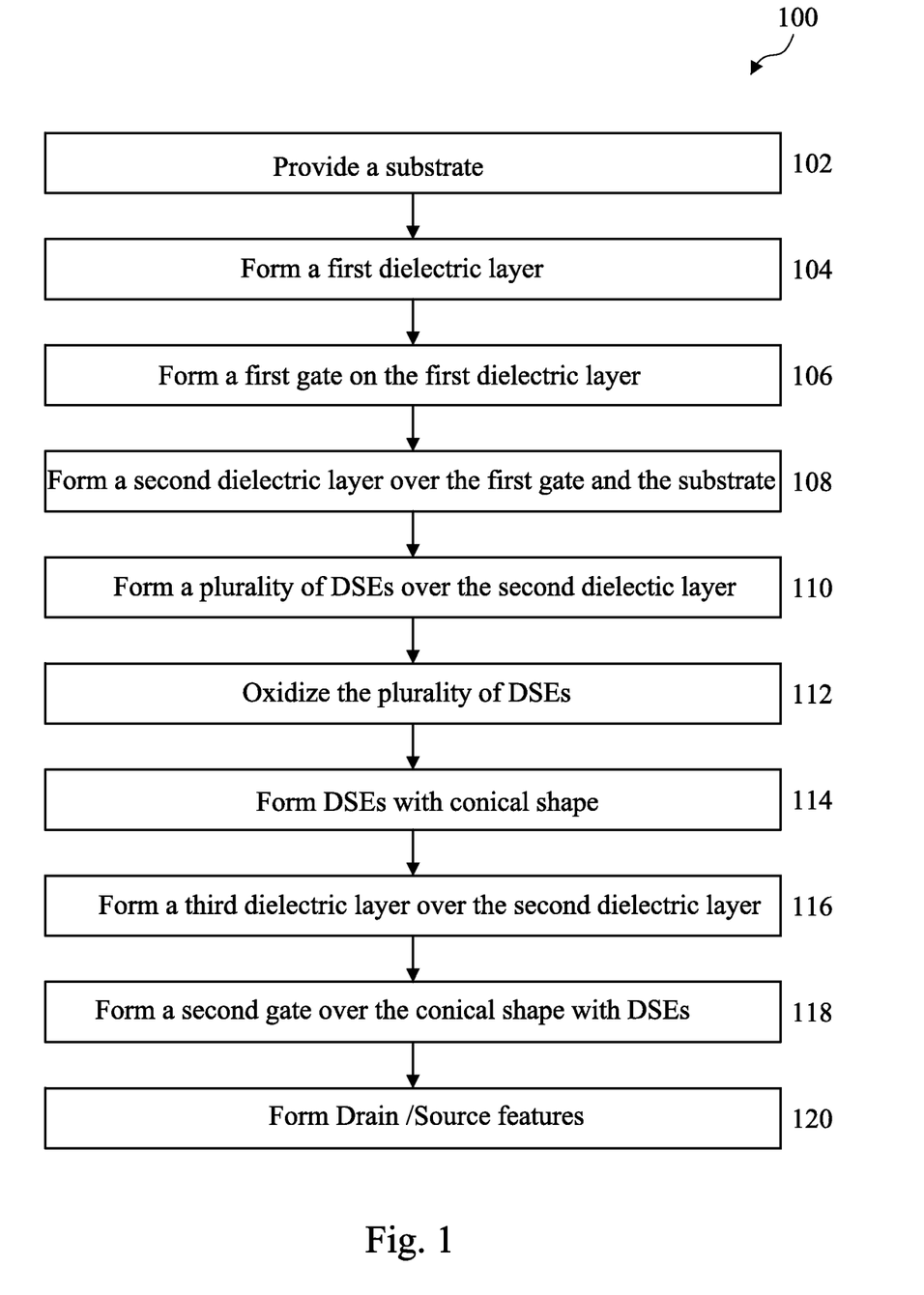
FIG. 1 depicts a method of fabricating a memory device in accordance with various embodiments.

FIG. 1 is a flowchart of a method 100 of fabricating a memory device 200 constructed according to various aspects of the present disclosure in one or more embodiments. The method 100 is described with reference to FIG. 1 and in conjunction with FIGS. 2A, 2B, 2C, 2D, 2E, 2F, 2G, 2H, and 2I. FIGS. 2A-2I are cross sectional views of forming the memory device 200 by the method 100 according to some embodiments. In some embodiments, the memory device 200 fabricated according to the disclosed method 100 may be a memory element of a non-volatile memory device and such a memory element is a split-gate thin-film storage device although the memory element may be one of a variety of suitable storage devices. It is understood that additional steps can be provided before, during, and/or after the method 100, and some of the steps described can be replaced, eliminated, and/or moved around for additional embodiments of the method 100.

Figure 2A:
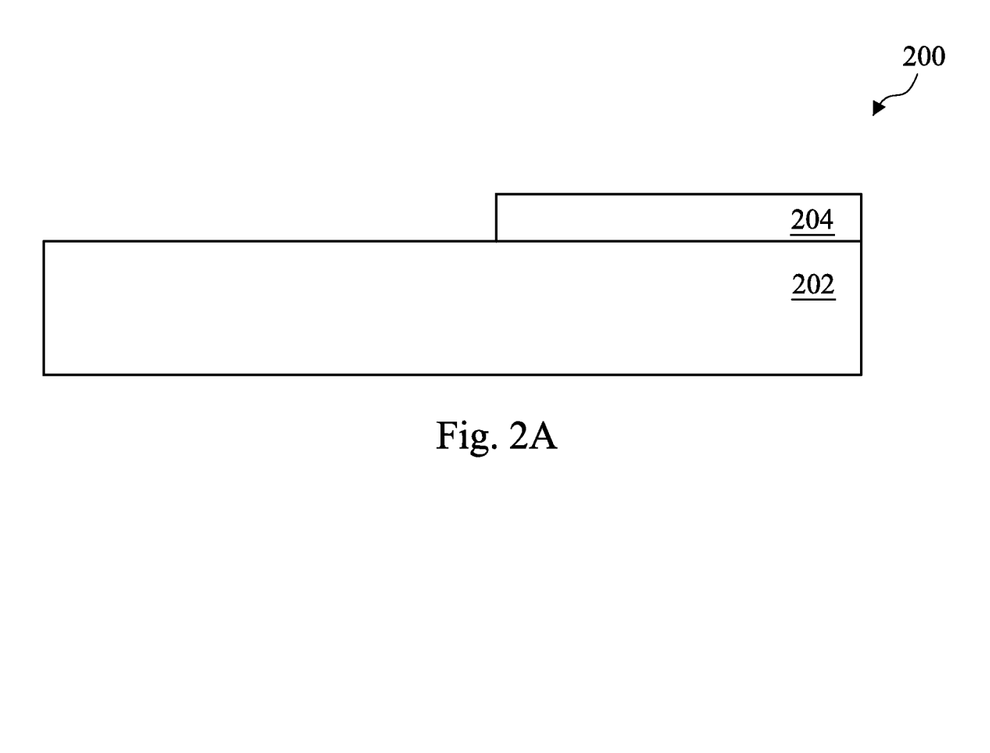
FIGS. 2A, 2B, 2C, 2D, 2E, 2F, 2G, 2H, 2I, 2J, 2K depict cross-sectional views of a memory device fabricated by the method of FIG. 1 in accordance with various embodiments.

Referring to FIGS. 1 and 2A, method 100 begins at operation 102 with providing a substrate 202. In an embodiment, the substrate 202 is a semiconductor substrate and includes silicon. Alternatively, the substrate includes germanium, silicon germanium or other proper semiconductor materials such as III/V materials. In another embodiment, the substrate 202 may include a buried dielectric material layer for isolation formed by a proper technology, such as a technology referred to as separation by implanted oxygen (SIMOX). In some embodiments, the substrate 202 may be a semiconductor on insulator, such as silicon on insulator (SOI).

Still referring to FIGS. 1 and 2A, method 100 proceeds to operation 104 with forming a first dielectric layer 204 on substrate 202, as illustrated in FIG. 2A. In the illustrated embodiment of FIG. 2A, the first dielectric layer 204 is formed to overlay part of the substrate 202. The forming of the first dielectric layer 204 may include at least one process such as for example, a deposition process, a lithography process to form a photo resist pattern, an etching process, and a cleaning process to form the first dielectric layer 204. Here, the first dielectric layer 204 has been patterned such that a portion of substrate 202 is exposed. In some embodiments, the first dielectric layer 204 may be formed of dielectric materials or high-k materials.

Figure 2B:
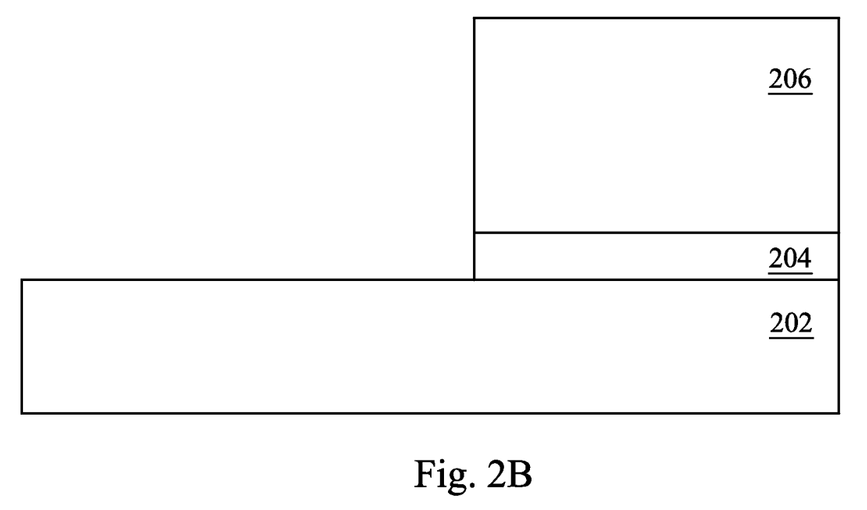

Referring to FIGS. 1 and 2B, method 100 proceeds to operation 106 with forming a first conductive layer 206 over the first dielectric layer 204 and directly on the exposed portion of substrate 202. The forming of the first conductive layer 206 may include at least one process such as for example, a deposition process, a lithography process to form a photo resist pattern, an etching process, and a cleaning process to form the first conductive layer 206. In an example, the first conductive layer 206 may be formed of a metal, a metal alloy, a metal compound, a doped semiconductor material (e.g., a poly-silicon material), or any combination thereof. In accordance with the current embodiments that the device 200 is a split-gate thin-film storage device and the first conductive layer 206 serves as a select gate.

Figure 2C:
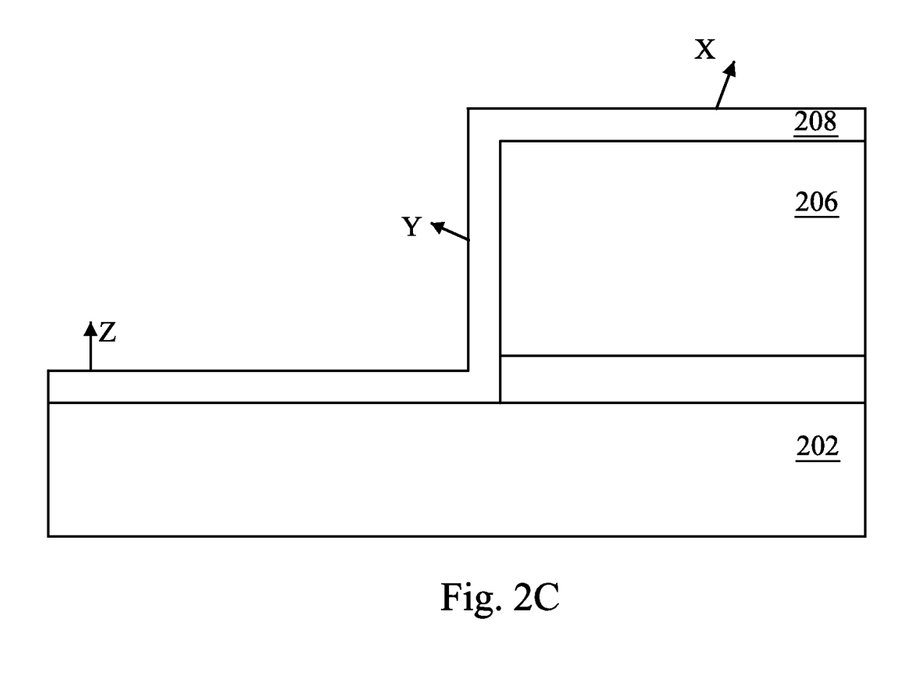

Referring to FIG. 2C, method 100 continues to operation 108 with forming a second dielectric layer 208 over the first conductive material 206. In the present embodiment, the second dielectric layer 208 is a silicon oxide layer that is formed by depositing the silicon oxide over the first conductive layer 206. Silicon oxide is used for the second dielectric material 208 in order to form a multi-layer of dielectrics in such a split-gate thin-film storage. As shown in the embodiment of FIG. 2C, second dielectric layer 208 includes a top surface 207 that includes a first portion X, a second portion Y, and a third portion Z.

In other embodiments, second dielectric material 208 can be formed of other dielectric materials. For example, second dielectric material 208 can be formed of any of a variety of oxide materials, or amorphous silicon.

Figure 2D:
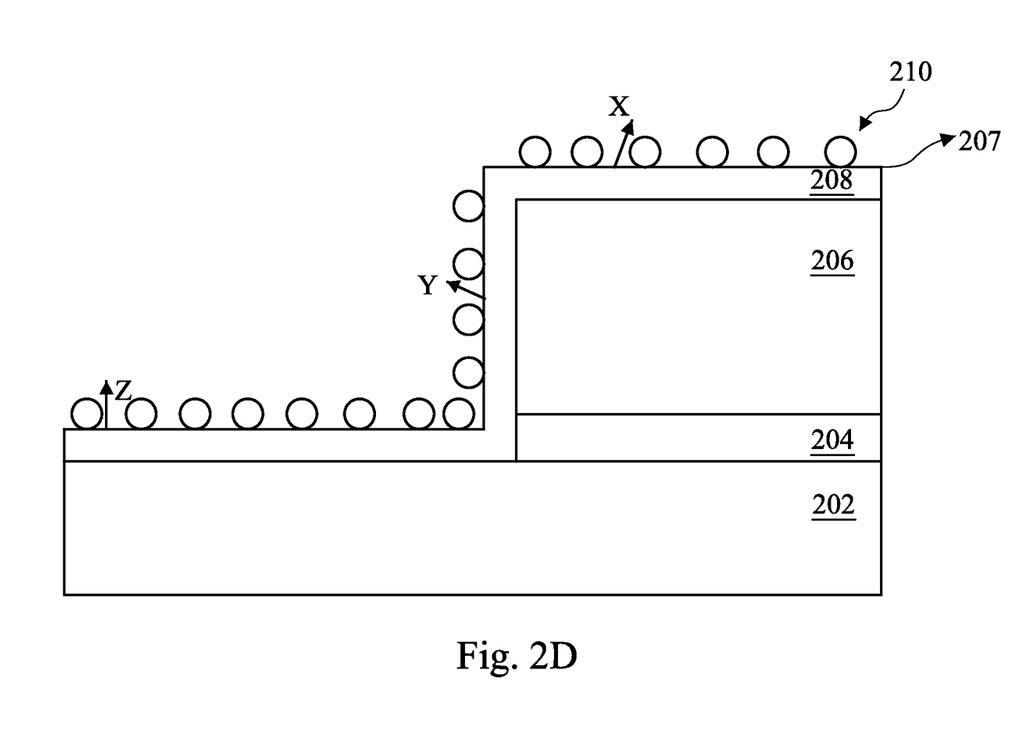

Referring to FIGS. 1 and 2D, method 100 proceeds to operation 110 with forming a plurality of discrete storage elements (DSEs) 210 over the second dielectric layer 208. As shown, the DSEs are formed on the first portion X, the second portion Y, and the third portion Z of the top surface 207 of the second dielectric material 208. DSEs 210 are a silicon-based nanocrystal such as for example, a silicon-based nano/quantum dot. The silicon-based nanodots each have a diameter ranging from about 10 nanometers to about 30 nanometers. In some embodiments, the DSEs 210 may be formed by an epitaxial growth technique. Yet in some embodiments, the DSEs 210 may be formed by depositing (e.g., low-pressure chemical vapour deposition (LPCVD)) a layer of amorphous silicon (not shown) over the second dielectric material 208 and then annealing the amorphous silicon layer. The annealing process causes the amorphous silicon layer to "ball up" to form the above-mentioned silicon-based nanocrystals.

Figure 2E:
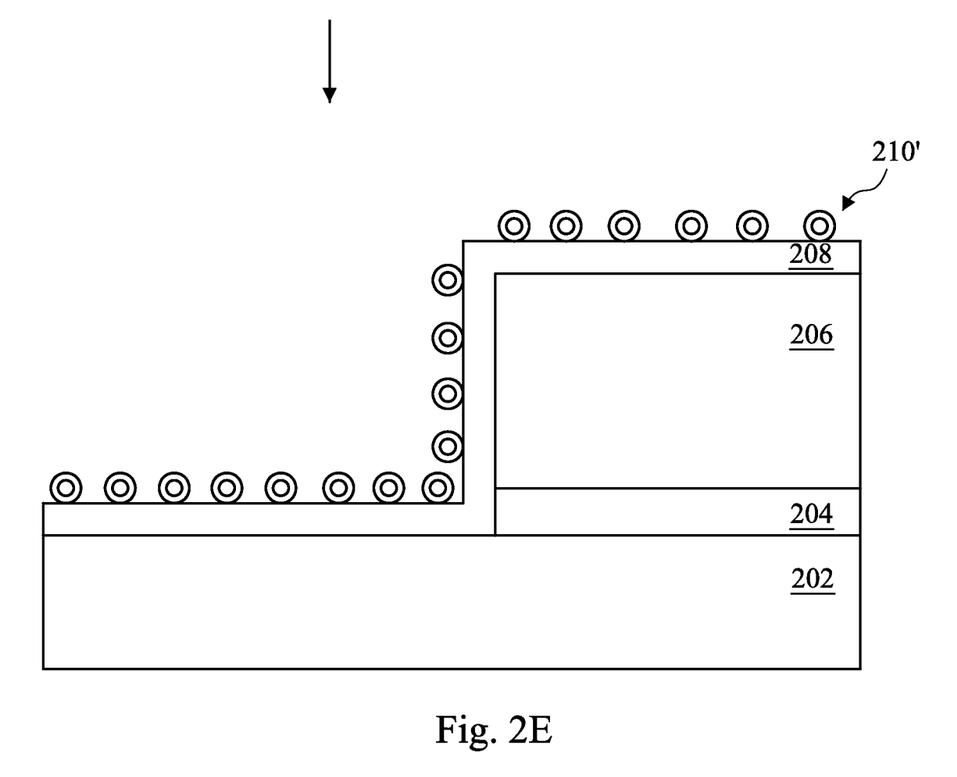

Referring to FIGS. 1 and 2E, method 100 then continues to operation 112 with oxidizing the DSEs 210 to form oxidized DSEs 210'. Oxidizing the DSEs 210 includes performing a thermal oxidation process.

Figure 2F:
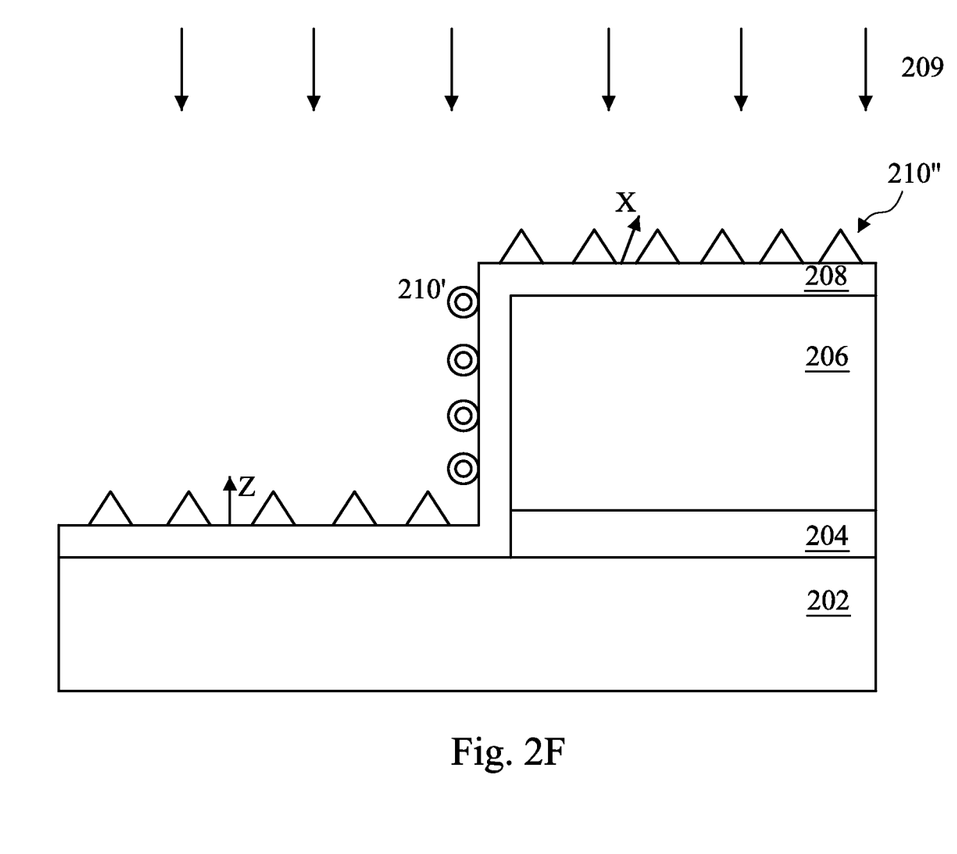

Referring to FIGS. 1 and 2F, method 100 continues to operation 114 with performing a treatment process 209 on the oxidized DSEs 210'. Treating the DSEs 210' includes using an argon-assisted sputtering process. In one embodiment, the argon-assisted sputtering process includes the following conditions: chamber pressure ranging between about 3 mini torr (mT) to about 20 mT; source power ranging between about 300 watt (W) to about 700 W; bias power ranging between about 100 W to about 400 W; flow rate of argon ranging between about 50 standard cubic centimeters per minute (sccm) to about 200 sccm. In such an argon-assisted sputtering process, argon/ionized argon is directed anisotropically (perpendicular to the substrate as indicated by arrows 209) to bombard the oxidized DSEs on the first portion X and third portion Z of top surface 207 to form treated DSE 210" having a conical profile. As shown, the DSEs on portion Y of to surface 207 of second dielectric layer 208 are not oxidized. Thus, the treated DSEs 210" only exist on the first portion X and third portion Z of top surface 207 of second dielectric layer 208 which is respectively over the first conductive material 206 and the substrate 202.

Figure 3:
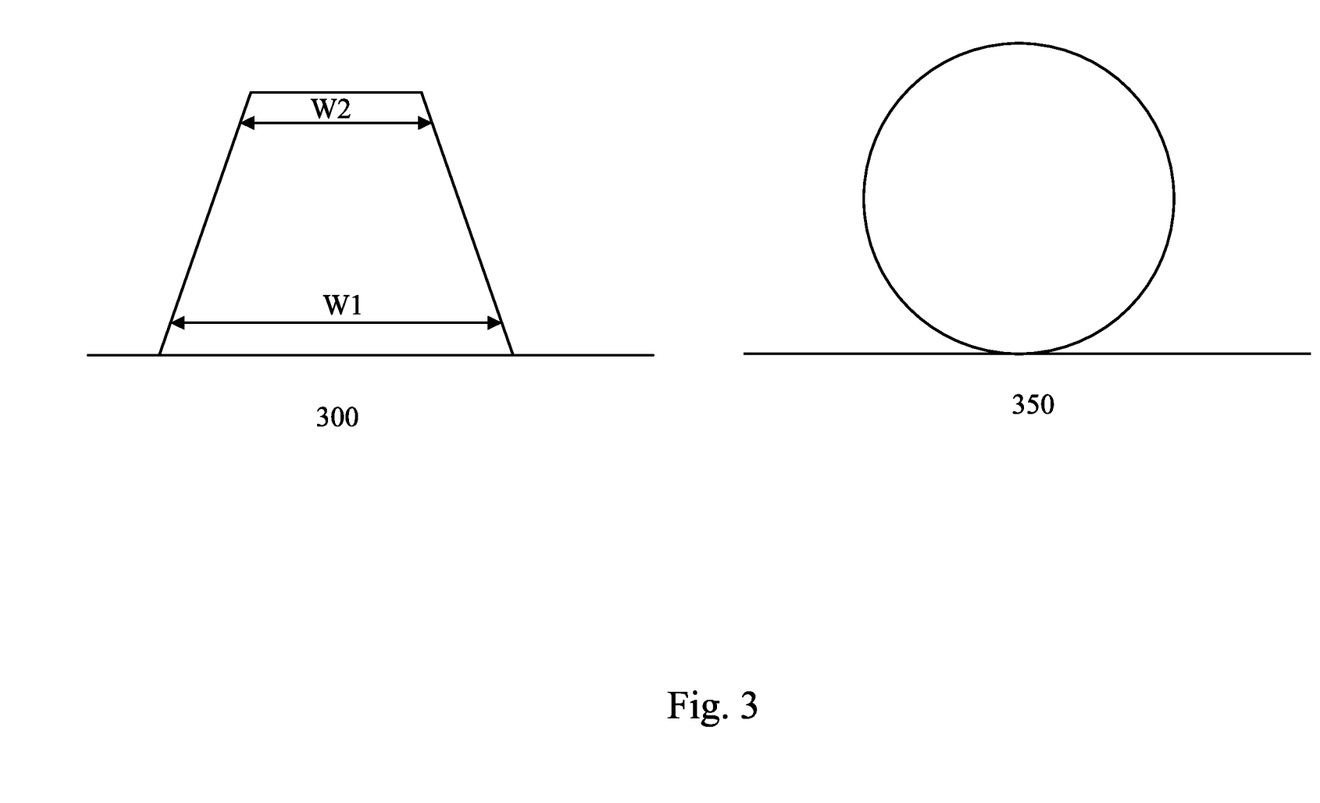
FIG. 3 depicts a comparison of cross-sectional views of a treated and an untreated discrete storage element (DSE) in accordance with various embodiments.

FIG. 3 shows perspective views of a treated DSE 210" having a conical profile (300) and of an untreated DSE 210' (350). As shown in 300 of FIG. 3, the treated DSE 210" has a conical profile that includes a wider width $W_1$ at a lower portion and a narrower width $W_2$ at an upper portion. In some embodiments, the wider width $W_1$ of the treated DSE 210" may range from about 10 nanometers to about 30 nanometers while narrower width $W_2$ of the treated DSE 210" is less about than 5 nanometers. In comparison, the untreated DSE 210' along the portion Y of top surface 207 includes a dot-based shape as shown in 350 of FIG. 3.

Figure 2G:
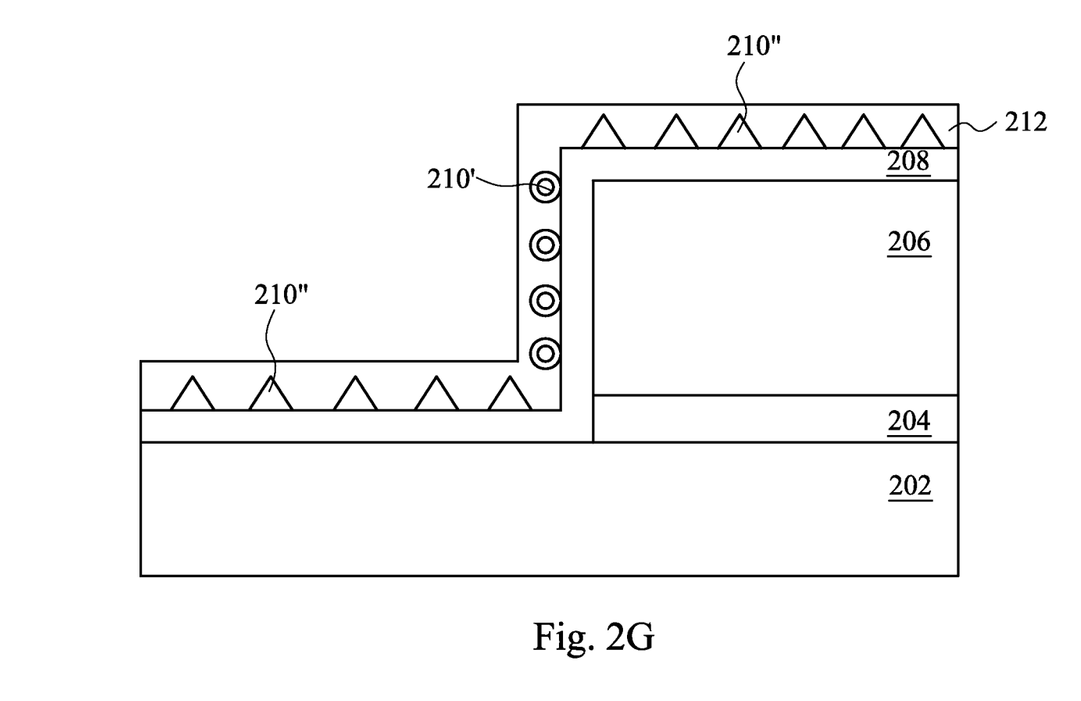

Referring to FIGS. 1 and 2G, method 100 proceeds to operation 116 with forming a third dielectric layer 212 over the second dielectric material 208 so as to cover the oxidized DSEs 210' and the treated DSEs 210". In the present embodiment, the third dielectric layer 212 is a silicon oxide layer that is formed by depositing the silicon oxide over the second dielectric material 208. That is, third dielectric layer 212 is formed of the same material as second dielectric layer 208. As shown, the second dielectric material 208, the oxidized DSEs 210', the treated DSEs 210", and the third dielectric material 212 form a multi-layer of dielectrics in a split-gate thin-film storage device.

In other embodiments, third dielectric layer 212 is formed of a different material than second dielectric layer 208. Moreover, second dielectric material 208 can be formed of other dielectric materials. For example, second dielectric material 208 can be formed of any of a variety of oxide materials, or amorphous silicon.

Figure 2H:
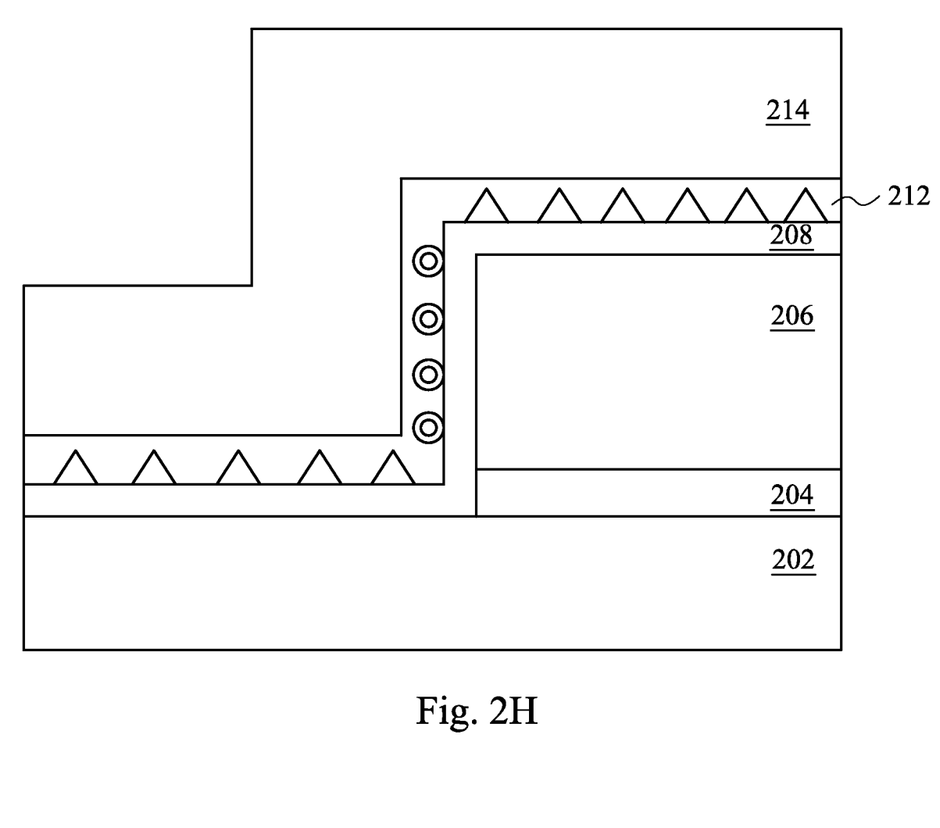

Referring to FIGS. 1 and 2H, method 100 continues to operation 118 with forming a second conductive layer 214 over the third dielectric material 212. In some embodiments, the second conductive layer 214 may be formed of a metal, a metal alloy, a metal compound, a doped semiconductor material (e.g., a poly-silicon material), or any combination thereof. That is, the second conductive layer 214 may be formed of an identical conductive material to or a different conductive material from the first conductive layer 206.

Figure 2I:
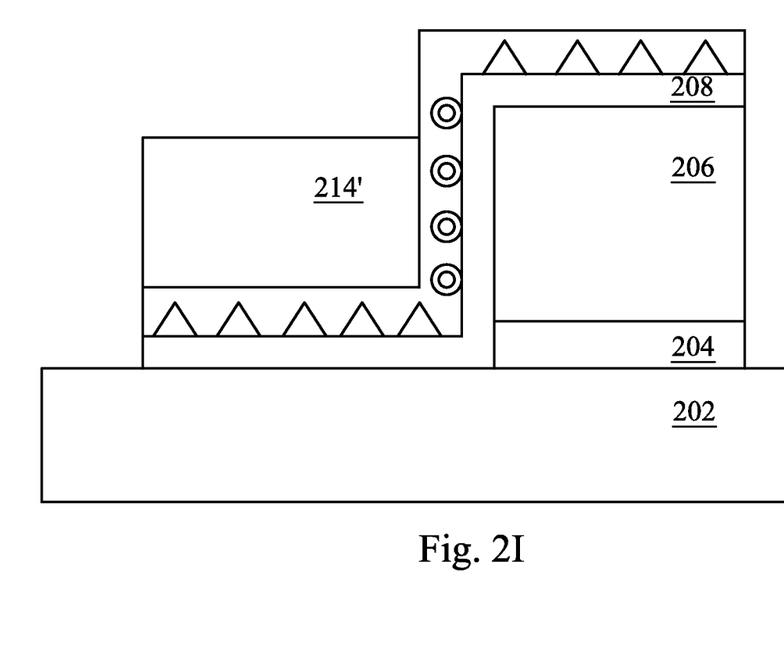

Referring to FIGS. 1 and 2I, second conductive layer 214 is patterned to form a control/main gate 214' of the split-gate thin-film storage device 200 shown in FIG. 2I. The forming of the control gate 214' may include multiple processes: a lithography process to form a photo resist pattern on the second conductive layer 214, an etching process, and a cleaning process to form the control gate 214'.

Figure 2J:
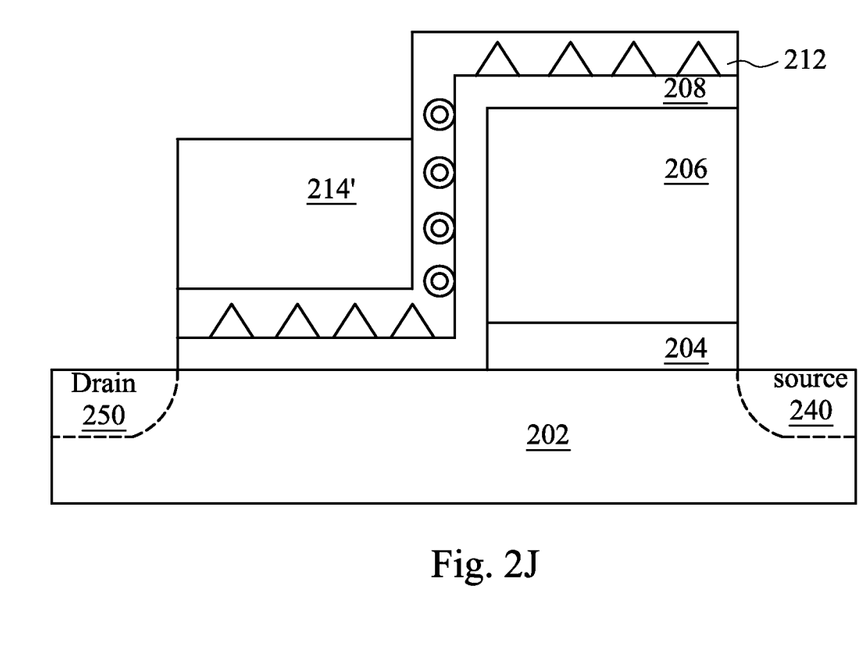

Also, as shown in FIG. 2J, method 100 may further proceed to operation 120 with forming source feature 240 and drain feature 250. The source and drain features may be formed via epitaxially growing and/or one of a variety of suitable processes such as such as a CVD process. The forming of the source/drain features may further include a lithography process to form a photo resist pattern, an etching process, a cleaning process, and an ion implantation process.

Figure 2K:
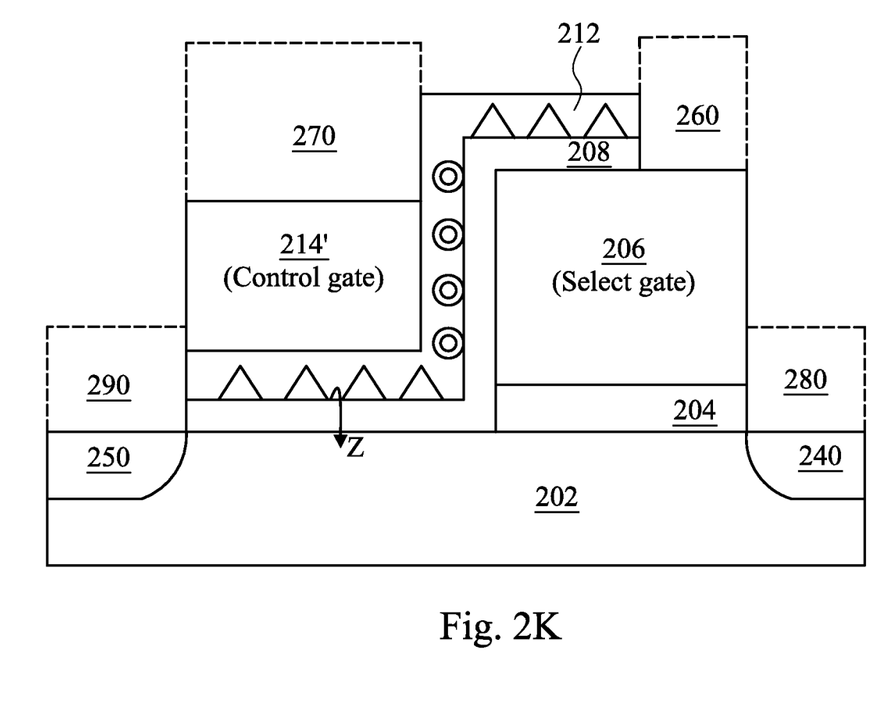

Also, the method 100 may further include at least one operation to form a respective electrode (e.g., 260, 270, 280, and 290) for the select gate 206, the control gate 214', the source feature 240, and the drain feature 250 (as shown in FIG. 2K). The forming of each electrode may include processes such as for example, a photo resist pattern forming process, an etching process, and a cleaning process. In the embodiment of FIG. 2K, the electrode 260 is formed to connect the select gate 206; the electrode 270 is formed to connect the control gate 214'; the electrode 280 is formed to connect the source feature 240; the electrode 290 is formed to connect the drain feature 250. More specifically, the first dielectric layer 204 may serve as a dielectric layer (e.g., oxide layer) for the select gate 206; the multi-layer of dielectrics (i.e., the second dielectric layer 208, DSEs 210" on portion Z, and the third dielectric layer 212) may serve as a dielectric layer for the control gate 214', wherein the DSEs 210" may be configured to store charges.

Various embodiments may provide certain benefits. In an example, after the treating of the DSEs (operation 114 with respect to FIG. 1) to form the conical profile, the non-uniform size distribution discussed above of DSEs may be circumvented. In a memory device that includes dot-based DSEs (i.e., the conventional DSEs), the threshold voltage of the memory device is highly sensitive to the size of the dot-sized DSEs. That is, a small variation of the size of the dot-sized DSEs may result in a large amount of threshold voltage variation. Such a large variation of threshold voltage is especially disadvantageous in a memory device. However, according to the present disclosure, the DSEs with the conical profile may provide a stronger immunity to such a non-uniform size distribution of the DSEs. After treating the dot-sized DSEs to have a conical shape, the non-uniform size distribution of the DSEs may be advantageously avoided since the narrower width at the upper portion (as shown in 300 with respect to FIG. 3) of each of the treated DSEs may in turn provide a smaller variation in terms of size. As such, the variation of the threshold voltage of the memory device may reduce accordingly.

Various embodiments of a method of fabricating a memory device are disclosed. In an embodiment, the method includes forming a first conductive layer over a substrate; forming a first dielectric layer over the first conductive layer and the substrate, the first dielectric layer including a first portion and a second portion; forming a plurality of discrete storage elements (DSEs) on the first and second portions of the first dielectric layer; treating the plurality of DSEs on the first portion of the first dielectric layer to form a plurality of treated DSEs while the plurality of DSEs on the second portion of the first dielectric layer are left untreated, wherein each DSE in the plurality of treated DSEs has a conical shape; forming a second dielectric layer over the plurality of treated DSEs on the first portion of the first dielectric layer and over the plurality of untreated DSEs on the second portion of the first dielectric layer; and forming a second conductive layer over the second dielectric layer.

In another embodiment, the method includes forming a first conductive layer over a substrate; forming a first dielectric layer over the first conductive layer and the substrate; forming a plurality of discrete storage elements (DSEs) on the first dielectric layer; oxidizing the plurality of DSEs; treating the plurality of oxidized DSEs thereby causing at least one of the oxidized DSEs to have a conical shape profile; forming a second dielectric layer overlaying the treated oxidized DSEs; forming a second conductive layer over the second dielectric layer; and forming a source/drain feature in the substrate.

Yet in another embodiment, an embodiment of a memory device is disclosed. The memory device includes a substrate having a top surface; a first dielectric layer disposed on a first portion of the top surface of the substrate; a first gate over the first dielectric layer; a plurality of discrete storage elements disposed on a second portion of the top surface of the substrate that is laterally adjacent to the first portion, wherein each of the discrete storage elements includes a conical shape profile; and a second gate over the plurality of discrete storage elements.

The foregoing has outlined features of several embodiments so that those skilled in the art may better understand the detailed description. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first conductive layer over a substrate;
    forming a first dielectric layer over the first conductive layer and the substrate, the first dielectric layer including a first portion and a second portion;
    forming a plurality of discrete storage elements (DSEs) on the first and second portions of the first dielectric layer;
    treating the plurality of DSEs on the first portion of the first dielectric layer to form a plurality of treated DSEs while the plurality of DSEs on the second portion of the first dielectric layer are left untreated, wherein each DSE in the plurality of treated DSEs has a conical shape;
    forming a second dielectric layer over the plurality of treated DSEs on the first portion of the first dielectric layer and over the plurality of untreated DSEs on the second portion of the first dielectric layer; and
    forming a second conductive layer over the second dielectric layer.

2. The method of claim 1, wherein the forming the first dielectric layer over the first conductive layer and the substrate includes forming the first dielectric layer directly on the substrate such that the first dielectric layer physically contacts the substrate.

3. The method of claim 1, further comprising thermally oxidizing the plurality of DSEs on the first dielectric layer before treating the plurality of DSEs.

4. The method of claim 1, wherein treating the plurality of DSEs includes an argon-assisted sputtering process.

5. The method of claim 4, wherein the argon-assisted sputtering process includes using a flow rate of argon from about 50 standard cubic centimeters per minute (sccm) to about 200 sccm.

6. The method of claim 1, wherein the forming the plurality of DSEs on the first dielectric layer includes using a chemical vapour deposition (CVD) process.

7. The method of claim 1, wherein each of the plurality of DSEs is a silicon-based nanocrystal.

8. The method of claim 7, wherein the silicon-based nanocrystal is a dot that includes size ranging from about 10 nanometers (nm) to about 30 nm.

9. The method of claim 1, wherein the first dielectric layer and the second dielectric layer are formed of a silicon dioxide material.

10. A method for fabricating a memory device, the method comprising:
    forming a first conductive layer over a substrate;
    forming a first dielectric layer over the first conductive layer and the substrate;
    forming a plurality of discrete storage elements (DSEs) on the first dielectric layer;
    oxidizing the plurality of DSEs;
    treating the plurality of oxidized DSEs thereby causing at least one of the oxidized DSEs to have a conical shape profile;
    forming a second dielectric layer overlaying the treated oxidized DSEs;
    forming a second conductive layer over the second dielectric layer; and
    forming a source/drain feature in the substrate.

11. The method of claim 10, wherein the memory device is a thin-film storage (TFS) device.

12. The method of claim 10, wherein the conical shape profile, from a cross-sectional view, includes an upper portion that has width not greater than 5 nanometers (nm) and a lower portion that has width ranging between about 10 nm to about 30 nm.

13. The method of claim 10, wherein the treating the plurality of oxidized DSEs includes an argon-assisted sputtering process.

14. The method of claim 13, wherein the argon-assisted sputtering process includes using a flow rate of argon ranging from about 50 standard cubic centimeters per minute (sccm) to about 200 sccm.

15. The method of claim 10, wherein the plurality of DSEs are silicon-based nanocrystals.

16. A device comprising:
   a substrate having a top surface;
   a first dielectric layer disposed on a first portion of the top surface of the substrate;
   a first gate over the first dielectric layer;
   a plurality of discrete storage elements disposed on a second portion of the top surface of the substrate that is laterally adjacent to the first portion, wherein each of the discrete storage elements includes a conical shape profile; and
   a second gate over the plurality of discrete storage elements.

17. The device of claim 16, further comprising:
   a second dielectric layer that is disposed between the plurality of discrete storage elements and the second portion of the top surface of the substrate; and
   a third dielectric layer that is disposed between the plurality of discrete storage elements and the second gate.

18. The device of claim 16, further comprising a source and a drain that are in the substrate and are each laterally adjacent to the first gate and the second gate.

19. The device of claim 16, wherein the first gate is a select gate of a thin-film storage (TFS) device and the second gate is a control gate of the TFS device.

20. The device of claim 16, wherein the conical shape profile, from a cross-sectional view, includes an upper portion that has width not greater than 5 nanometers (nm) and a lower portion that has width ranging between about 10 nm to about 30 nm.

* * * * *